(12) United States Patent
Merrill

(10) Patent No.: US 8,115,242 B2
(45) Date of Patent: Feb. 14, 2012

(54) PINNED PHOTODIODE CMOS PIXEL SENSOR

(75) Inventor: Richard B. Merrill, Woodside, CA (US)

(73) Assignee: Foveon, Inc., Santa Clara, CA (US)

( * ) Notice: Subject to any disclaimer, the term of this patent is extended or adjusted under 35 U.S.C. 154(b) by 1018 days.

(21) Appl. No.: 11/672,182

(22) Filed: Feb. 7, 2007

(65) Prior Publication Data
US 2008/0185619 A1    Aug. 7, 2008

(51) Int. Cl.
*H01L 31/113* (2006.01)

(52) U.S. Cl. ........ 257/292; 257/229; 257/225; 257/226; 257/219; 257/222; 257/291; 257/446; 257/445; 257/432; 257/462; 257/440; 257/293; 257/E31.084

(58) Field of Classification Search .............. 257/292, 257/E31.084, 229, 225, 226, 219, 222, 291, 257/446, 445, 432, 462, 463, 440, 293
See application file for complete search history.

(56) References Cited

U.S. PATENT DOCUMENTS

| 6,111,300 A | 8/2000 | Cao et al. |
| 6,433,373 B1 * | 8/2002 | Lee et al. ................... 257/292 |
| 6,727,521 B2 | 4/2004 | Merrill |
| 6,870,149 B2 | 3/2005 | Berezin |
| 6,965,102 B1 | 11/2005 | Merrill |
| 7,148,528 B2 | 12/2006 | Rhodes |
| 2004/0080638 A1 * | 4/2004 | Lee ................................ 348/272 |
| 2004/0179120 A1 * | 9/2004 | Shizukuishi ................... 348/272 |
| 2006/0267053 A1 * | 11/2006 | Yang et al. .................... 257/291 |
| 2007/0114626 A1 * | 5/2007 | Kang et al. .................... 257/431 |
| 2007/0131992 A1 * | 6/2007 | Dosluoglu et al. ............ 257/292 |

OTHER PUBLICATIONS

International Search Report and Written Opinion dated Jul. 7, 2008 of corresponding International Patent Application No. PCT/US2008/052934 filed Feb. 4, 2008, 6 pages.
Nakamura, Junichi, "Image Sensors and Signal Processing for Digital Still Cameras," 2006, Title Pages front and back & pp. 162-163, 5.3.1.1 "Column Correlated Double Sampling (CDS) Scheme,"CRC Press Taylor and Francis Group, Boca Raton, FL.

\* cited by examiner

*Primary Examiner* — Junghwa M Im
(74) *Attorney, Agent, or Firm* — Lewis and Roca LLP

(57) ABSTRACT

A multicolor CMOS pixel sensor formed in a p-type semiconductor region includes a first detector formed from an n-type region of semiconductor material located near the surface of the p-type region. A first pinned p-type region is formed at the surface of the p-type region over the first detector, and has a surface portion extending past an edge of the pinned p-type region. A second detector is formed from an n-type region located in the p-type semiconductor region below the first detector. A second-detector n-type deep contact plug is in contact with the second detector and extends to the surface of the p-type semiconductor region. A second pinned p-type region is formed at the surface of the p-type semiconductor region over the top of the second-detector n-type deep contact plug. A surface portion of the second-detector deep contact plug extends past an edge of the second pinned p-type region.

14 Claims, 3 Drawing Sheets

PINNED PHOTODIODE CMOS PIXEL SENSOR

BACKGROUND OF THE INVENTION

1. Field of the Invention

The present invention relates to CMOS imaging arrays. More particularly, the present invention relates to low-leakage vertical multi-color CMOS imaging arrays.

2. The Prior Art

CMOS pixel sensors have become more prevalent in the art. Such pixel sensors typically employ a photodiode to collect charge and a select transistor and source-follower amplifier to read the charge out of the pixel sensor.

Multicolor versions of these pixel sensors are also known. Early examples of such sensors used an array of detectors formed in a pattern such as a Bayer pattern. Recently, vertical-color-filter CMOS pixel sensors have been disclosed, in which multiple pixel sensors (such as blue, green, and red) are positioned at different depths in a semiconductor body to take advantage of the fact that the penetration depth is a function of photon energy. Contact to the detectors disposed beneath the surface of the silicon body is made through deep contact structures. An example of such a pixel sensor arrangement is shown in U.S. Pat. No. 6,727,521.

One of the common problems associated with pixel sensors is leakage current at the surface of the silicon body in which the pixel sensors are fabricated. This problem is particularly troublesome with respect to the blue detector, which is located at or near the silicon surface.

BRIEF DESCRIPTION OF THE INVENTION

According to one aspect of the present invention, a multicolor CMOS pixel sensor formed in a p-type semiconductor region includes a first detector formed from an n-type region of semiconductor material located near the surface of the p-type semiconductor region. A first pinned p-type region is formed at the surface of the p-type region over the first detector, and has a surface portion extending past an edge of the pinned p-type region. A second detector is formed from an n-type region located in the p-type semiconductor region below the first detector. A second-detector n-type deep contact plug is in contact with the second detector and extends to the surface of the p-type region. A second pinned p-type region is formed at the surface of the p-type semiconductor region over the top of the second-detector n-type deep contact plug. A surface portion of the second-detector deep contact plug extends past an edge of the second pinned p-type region. Polysilicon gates define color-select transistors formed between the surface portions of the first and second detectors and other doped regions.

According to a first aspect of the present invention, a multicolor CMOS pixel sensor is formed, preferably in a p-type region on a semiconductor substrate. The multicolor CMOS pixel sensor includes a blue detector formed from an n-type region of semiconductor material located near the surface of the p-type semiconductor region. A pinned p-type region is formed at the surface of the p-type semiconductor region over the blue detector. A surface portion of the blue-detector n-type region extends past the edge of the pinned p-type region and lies at the surface of the p-type semiconductor region. A polysilicon gate electrode is formed over and insulated from the surface of the p-type semiconductor region and is self-aligned with the edge of the surface portion of the blue detector region and with the edge of a blue-select transistor n+ source/drain region spaced apart from the surface portion of the blue detector region to form a blue-select transistor.

A green detector formed from an n-type region is located in the p-type semiconductor region below the blue detector at a depth selected to optimize collection of photons in the green region of the spectrum. A green-detector n-type deep contact plug is formed so as to make contact with the green detector. A pinned p-type region is formed at the surface of the p-type region over the top of the green-detector n-type deep contact plug near the surface of the p-type semiconductor region. A surface portion of the green-detector n-type deep contact plug extends past the edge of the pinned p-type region and lies at the surface of the p-type semiconductor region. A polysilicon gate electrode is formed over and insulated from the surface of the p-type semiconductor region and is self-aligned with the edge of the surface portion of the green-detector n-type deep contact plug and with the edge of a green-select transistor n+ source/drain region spaced apart from the surface portion of the green-detector n-type deep contact plug to form a green-select transistor.

A red detector formed from an n-type region is located in the p-type semiconductor region below the green detector at a depth selected to optimize collection of photons in the red region of the spectrum. A red-detector n-type deep contact plug is formed so as to make contact with the red detector. A pinned p-type region is formed at the surface of the p-type semiconductor region over the top of the red-detector n-type deep contact plug near the surface of the p-type semiconductor region. A surface portion of the red-detector n-type deep contact plug extends past the edge of the pinned p-type region and lies at the surface of the p-type semiconductor region. A polysilicon gate electrode is formed over and insulated from the surface of the p-type semiconductor region and is self-aligned with the edge of the surface portion of the red-detector n deep contact plug and with the edge of a red-select transistor n+ source/drain region spaced apart from the surface portion of the red-detector n-type deep contact plug to form a red-select transistor.

According to another aspect of the present invention, the blue detector may be operated in an un-depleted operating mode, or may be operated in a depleted mode in which all charge is removed from the detector prior to charge collection. The charge is then collected and then transferred out of the detector.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

Figure 1:
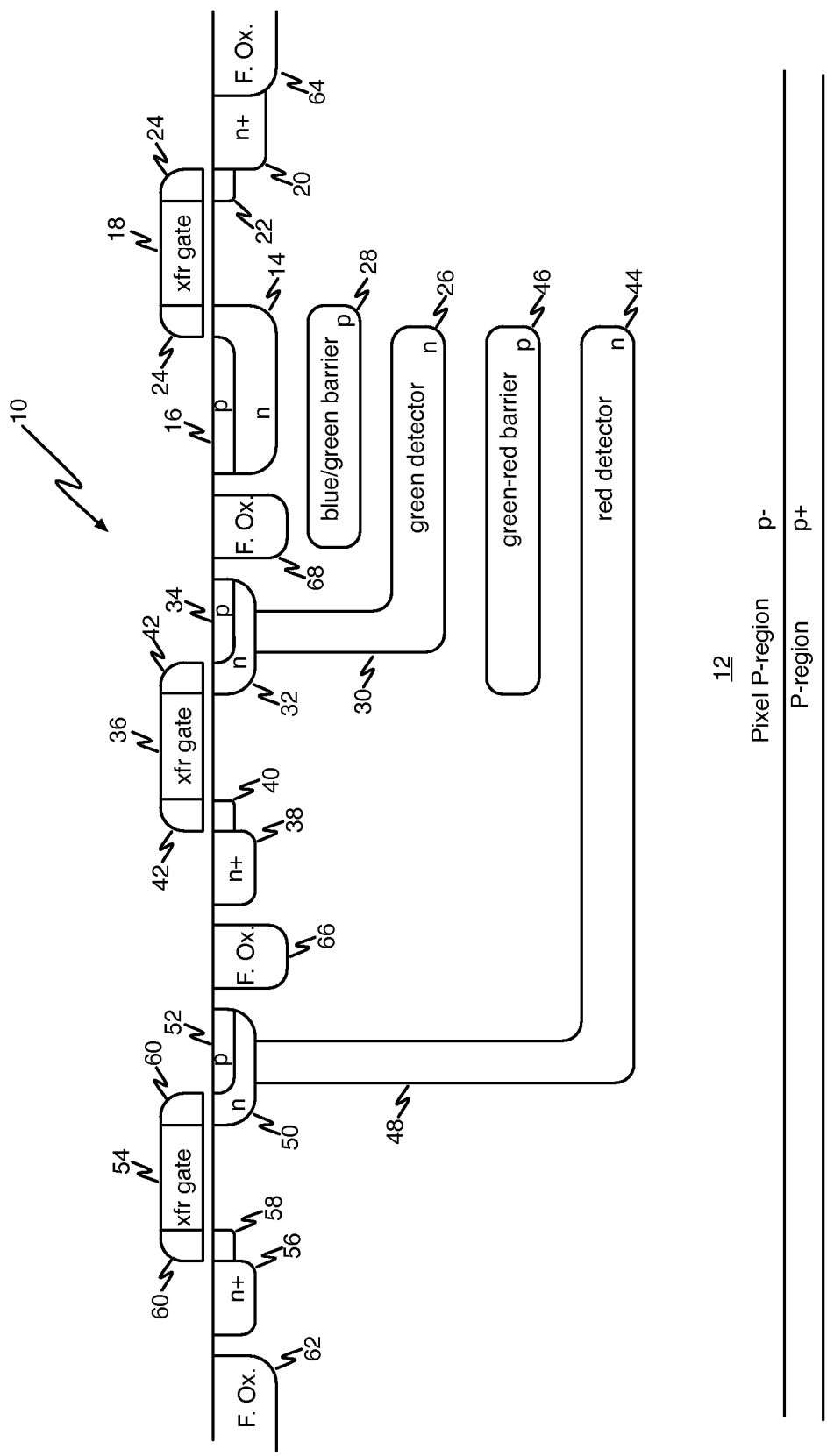
FIG. 1 is a cross-sectional diagram of a portion of an integrated circuit showing details of an illustrative three-color pixel sensor according to the present invention.

Referring first to FIG. 1, a multicolor CMOS pixel sensor 10 is formed in a p-type semiconductor region, preferably in a p-type region 12 formed in a semiconductor substrate. Persons of ordinary skill in the art will appreciate that the pixel sensor shown in the cross sectional view of FIG. 1 is illustrative only and that the relative locations of the semiconductor structures depicted therein have been selected to illustrate the structures rather than to provide a layout for an actual integrated circuit employing the pixel sensor of the present invention. Such skilled persons will also appreciate that the pixel sensor depicted in FIG. 1 could also be formed directly in a p-type substrate.

The multicolor CMOS pixel sensor 10 includes a blue detector 14 formed from an n-type region of semiconductor material located near the surface of the p-type region 12. A pinned p-type region 16 is formed at the surface of the p-type region 12 over the blue detector 14. As used herein, a "pinned" region is such that the Si/SiO$_2$ interface is maintained at the substrate potential. A surface portion of the blue-detector n-type region 14 extends past the edge of the pinned p-type region 16 and lies at the surface of the p-type region 12.

A polysilicon gate electrode 18 is formed over and insulated from the surface of the p-type region 12 and is self-aligned with the edge of the surface portion of the blue detector region 14 and with the edge of a blue-select transistor n+ source/drain region 20 spaced apart from the surface portion of the blue detector region 16 to form a blue-select transistor. A lightly-doped-drain (LDD) region 22 extends into the channel of the blue select transistor to the left of blue-select transistor n+ source/drain region 20. Spacers 24 are disposed at the edges of gate electrode 18 as is known in the art.

A green detector 26 formed from an n-type region is located in the p-type region 12 below the blue detector 14 at a depth selected to optimize collection of photons in the green region of the spectrum. A p-type blue/green barrier region 28 is disposed in the p-type region 12 between the blue detector 14 and the green detector 26.

A green-detector n-type deep contact plug 30 is formed so as to make contact both with the green detector and with a green n-type contact region 32 at the surface of the p-type region 12. A pinned p-type region 34 is formed at the surface of the p-type region over the top of the green-detector n-type deep contact plug 30 and n-type contact region 32 at the surface of the p-type region 12. The contact plug 30 is formed by implantation at energies sufficient to locate the target depth of the dopants below the pinning region. A surface portion of the green-detector green n-type contact region 34 extends past the edge of the pinned p-type region 32 and lies at the surface of the p-type region 12. In an alternative embodiment, n-type deep contact plug 30 could extend under the gate to be formed over the structure, eliminating the need for region 32.

A polysilicon gate electrode 36 is formed over and insulated from the surface of the p-type region 12 and is self-aligned with the edge of the surface portion of the green n-type deep contact region 34 and with the edge of a green-select transistor n+ source/drain region 38 spaced apart from the surface portion of the green-detector n-type deep contact plug to form a green-select transistor. A lightly-doped-drain (LDD) region 40 extends into the channel of the blue select transistor to the left of green-select transistor n+ source/drain region 38. Spacers 42 are disposed at the edges of gate electrode 18 as is known in the art.

A red detector 44 formed from an n-type region is located in the p-type region 12 below the green detector 26 at a depth selected to optimize collection of photons in the red region of the spectrum. A p-type green/red barrier region 46 is disposed in the p-type region 12 between the green detector 24 and the red detector 44.

A red-detector n-type deep contact plug 48 is formed so as to make contact with both the red detector 44 and with a red n-type contact region 50 at the surface of the p-type region 12. A pinned p-type region 52 is formed at the surface of the p-type region over the top of the red n-type contact region 50 at the surface of the p-type region 12. The contact plug 48 is formed by implantation at energies sufficient to locate the target depth of the dopants below the pinning region. A surface portion of the red n-type contact region 50 extends past the edge of the pinned p-type region 52 and lies at the surface of the p-well. A polysilicon gate electrode 54 is formed over and insulated from the surface of the p-type region 12 and is self-aligned with the edge of the surface portion of the red n-type contact region 50 and with the edge of a red-select transistor n+ source/drain region 56 spaced apart from the surface portion of the red n-type contact region 50 to form a red-select transistor. Spacers 60 are disposed at the edges of gate electrode 54 as is known in the art. In an alternative embodiment, n-type deep contact plug 48 could extend under the gate to be formed over the structure, eliminating the need for region 50.

Field oxide region 62 at the left-hand side of FIG. 1 isolates red n+ source/drain region 56 from whatever structures are located off of the left hand side of FIG. 1. Field oxide region 64 at the right-hand side of FIG. 1 isolates blue n+ source/drain region 20 from whatever structures are located off of the right-hand side of FIG. 1. Field oxide region 66 isolates the red detector output n-type region 50 from green n+ source/drain region 38, and field oxide region 68 isolates the green detector output n-type region 32 from the blue detector output n-type region 14.

Figure 2:
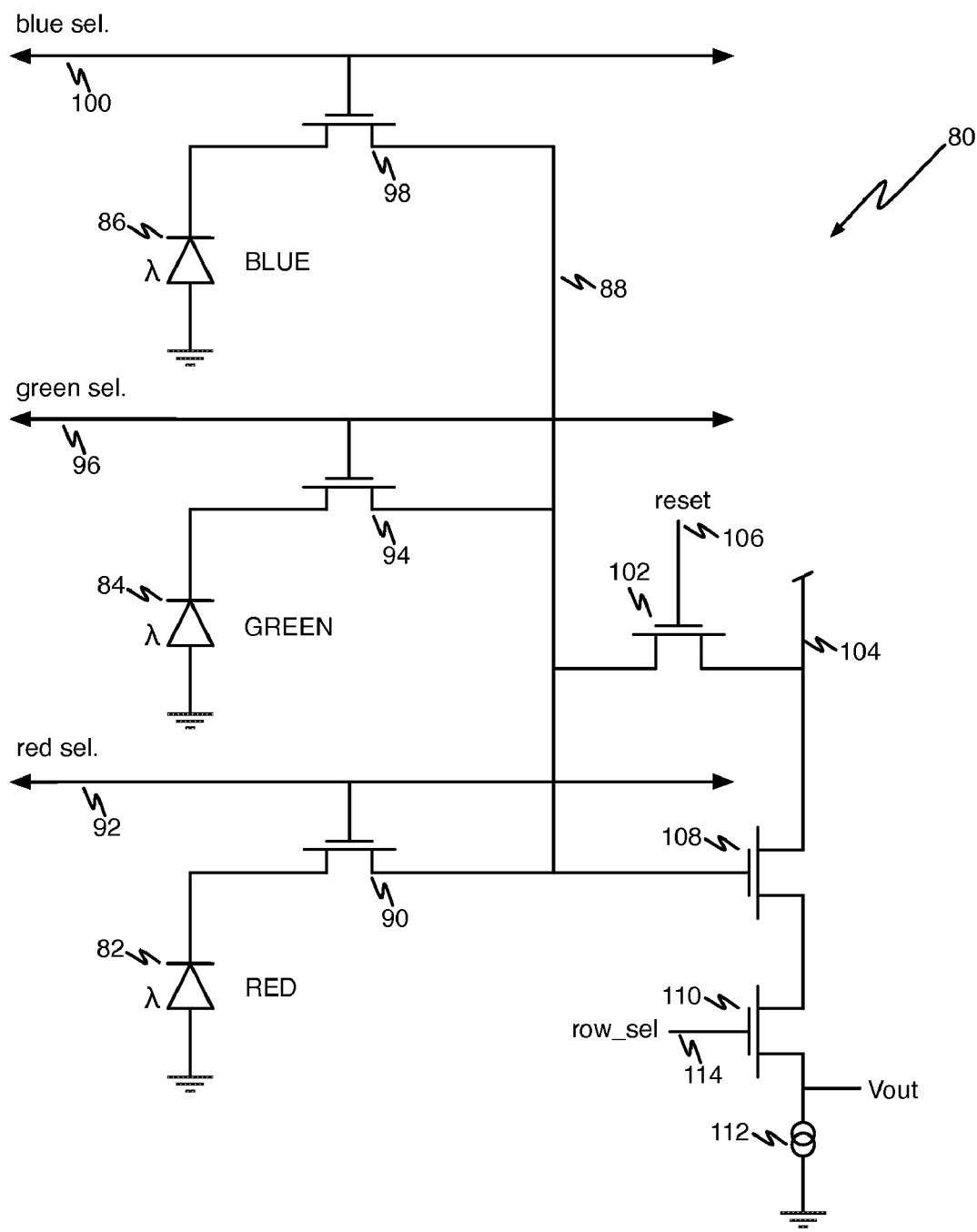
FIG. 2 is a schematic diagram showing details of an illustrative three-color pixel sensor according to the present invention.

Referring now to FIG. 2, a schematic diagram shows details of an illustrative three-color pixel sensor 80 according to the present invention. Persons of ordinary skill in the art will readily appreciate that other circuit configurations are possible.

Three-color pixel sensor 80 includes a red photodiode 82, a green photodiode 84, and a blue photodiode 86. Persons of ordinary skill in the art will appreciate that more than one photodiode of one or more of the colors could be used, with a corresponding increase in the number of transistors present in the pixel sensor. The anodes of photodiodes 82, 84, and 86 are connected to ground and the cathodes of photodiodes 82, 84, and 86 comprise photocharge collection nodes for the three colors.

The cathodes of photodiodes 82, 84, and 86 are coupled to a common sensing node 88, through select transistors. A red-select transistor 90 is coupled between the cathode of red photodiode 82 and sensing node 88. The gate of red-select transistor 90 is coupled to a red-select line 92. A green-select transistor 94 is coupled between the cathode of green photodiode 84 and sensing node 88. The gate of green-select transistor 94 is coupled to a green-select line 96. A blue-select transistor 98 is coupled between the cathode of blue photodiode 86 and sensing node 88. The gate of blue-select transistor 98 is coupled to a blue-select line 100.

A common reset transistor 102 is coupled between $V_{DD}$ at reference numeral 104 and common sensing node 88. The gate of reset transistor 102 is coupled to a reset line 106.

A source-follower transistor 108 has its gate coupled to sensing node 88, its drain coupled to $V_{DD}$ line 104, and its source coupled to the drain of a row-select transistor 110. The source of the row-select transistor 110 is coupled to a current source 112 and its gate is coupled to a readout (row-select) line 114. When a signal is asserted on one of red-select line 92, green-select line 96, or blue-select line 100 and a row-select signal is asserted on the gate of row-select transistor 110, transistor 108 acts as a source follower and the voltage $V_{out}$ appears at its source and represents the stored charge on the selected one of the photodiodes.

Several techniques may be employed to read color image data out of the pixel sensor of the present invention. A correlated double-sampling technique is particularly useful for this purpose. Correlated double sampling is well known in the art and is described in "Image Sensors and Signal Processing for Digital Still Cameras," ed. by Junichi Nakamura, Taylor & Francis Group, Publisher, ISBN 0-8493-3545-0.

Figure 3:
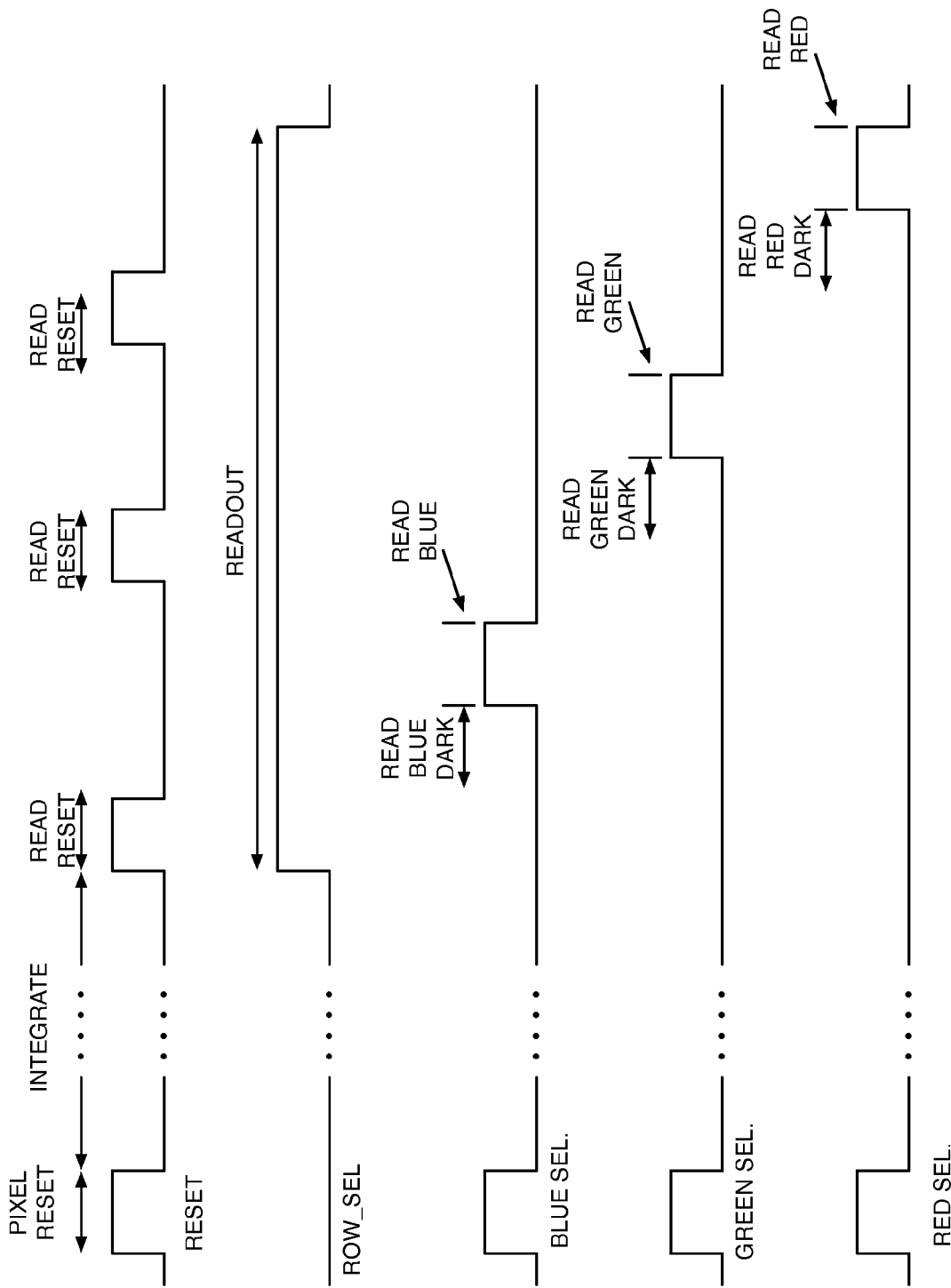
FIG. 3 is a timing diagram showing a method for operating a three-color pixel sensor according to the present invention.

Accordingly, and as shown in FIG. 3, the pixel is first reset by asserting a reset signal at the gate of reset transistor 102 on reset line 106 while select signals are asserted on the red-select, green-select, and blue-select lines 92, 96, and 100. Photocurrent is then integrated on the capacitance of the cathode of each of the photodiodes 82, 84, and 86 and that of the source/drain diffusion of the color-select transistors 90, 94, and 98 to which they are coupled.

After the integration period, a read reset operation is performed by asserting a reset signal at the gate of reset transistor 102 on reset line 106. The common sensing node 88 is reset before reading each color. Assuming that the colors are to be read out in the order blue, green, then red, a signal is asserted on the row-select line 114 and the blue dark level is then read out. Next, the blue signal is read by applying a signal to the blue-select line 100. The common sensing node 88 is then reset prior to reading the green signal. The green dark level is then read out. Next, the green signal is read by applying a signal to the green-select line 96. The common sensing node 88 is then reset prior to reading the red signal. The red dark level is then read out. Next, the red signal is read by applying a signal to the red-select line 96. Persons of ordinary skill in the art will appreciate that, while FIG. 3 shows a readout sequence of first the blue, then the green, then the red signals, the colors may be read out in any order.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A multicolor CMOS pixel sensor formed in a p-type semiconductor region, the multicolor CMOS pixel sensor including:
   a first detector for a first color formed from an n-type region of semiconductor material located near the surface of the p-type semiconductor region;
   a first pinned p-type region formed at the surface of the p-type semiconductor region over the first detector, a surface portion of the n-type region for the first detector extending past an edge of the pinned p-type region;
   a second detector for a second color formed from an n-type region located in the p-type semiconductor region below the first detector;
   a second-detector n-type deep contact plug in contact with the second detector and extending to the surface of the p-type semiconductor region;
   a second pinned p-type region formed at the surface of the p-type semiconductor region over the top of the second-detector n-type deep contact plug, a surface portion of the second-detector n-type deep contact plug extending past an edge of the second pinned p-type region;
   a third detector for a third color formed from an n-type region located in the p-type semiconductor region below the second detector;
   a third-detector n-type deep contact plug in contact with the third detector and extending to the surface of the p-type semiconductor region;
   a third pinned p-type region formed at the surface of the p-type semiconductor region over the top of the third-detector n-type deep contact plug near the surface of the p-type semiconductor region, a surface portion of the third-detector n-type deep contact plug extending past the edge of the pinned p-type region.

2. The multicolor CMOS pixel sensor of claim 1, further including:
   a first polysilicon gate electrode formed over and insulated from the surface of the p-type semiconductor region and self-aligned with an edge of the surface portion of the n-type region for the first detector and with an edge of the n+ source/drain region to form a first-color select transistor;
   a second polysilicon gate electrode formed over and insulated from the surface of the p-type semiconductor region and self-aligned with an edge of the surface portion of the second-detector n-type deep contact plug and with an edge of the n+ source/drain region to form a second-color select transistor; and
   a third polysilicon gate electrode formed over and insulated from the surface of the p-type semiconductor region and self-aligned with an edge of the surface portion of the third-detector n-type deep contact plug and with an edge of the n+ source/drain region to form a third-color select transistor.

3. The multicolor CMOS pixel sensor of claim 1 wherein the p-type semiconductor region is a p-well formed in a body of semiconductor material.

4. The multicolor CMOS pixel sensor of claim 3 wherein the body of semiconductor material is a semiconductor substrate.

5. A multicolor CMOS pixel sensor formed in a p-type semiconductor region on a semiconductor substrate, the multicolor CMOS pixel sensor including:
   a blue detector formed from an n-type region of semiconductor material located near the surface of the p-type semiconductor region;
   a pinned p-type region formed at the surface of the p-type semiconductor region over the blue detector, a surface portion of the blue-detector n-type region extending past an edge of the pinned p-type region;
   a green detector formed from an n-type region located in the p-type semiconductor region below the blue detector;
   a green-detector n-type deep contact plug in contact with the green detector and extending to the surface of the p-type semiconductor region;
   a pinned p-type region formed at the surface of the p-type semiconductor region over the top of the green-detector n-type deep contact plug, a surface portion of the green-detector n-type deep contact plug extending past an edge of the pinned p-type region;
   a red detector formed from an n-type region located in the p-type semiconductor region below the green detector;
   a red-detector n-type deep contact plug in contact with the red detector and extending to the surface of the p-type semiconductor region;
   a pinned p-type region formed at the surface of the p-type semiconductor region over the top of the red-detector n-type deep contact plug near the surface of the p-type semiconductor region, a surface portion of the red-detector n-type deep contact plug extending past the edge of the pinned p-type region.

6. The multicolor CMOS pixel sensor of claim 5 wherein the p-type semiconductor region is a p-well formed in a body of semiconductor material.

7. The multicolor CMOS pixel sensor of claim 6 wherein the body of semiconductor material is a semiconductor substrate.

8. A multicolor CMOS pixel sensor formed in a p-type semiconductor region on a semiconductor substrate, the multicolor CMOS pixel sensor including:
- a blue detector formed from an n-type region of semiconductor material located near the surface of the p-type semiconductor region;
- a pinned p-type region formed at the surface of the p-type semiconductor region over the blue detector, a surface portion of the blue-detector n-type region extending past an edge of the pinned p-type region;
- a blue-select transistor n+ source/drain region spaced apart from the surface portion of the blue detector region;
- a blue polysilicon gate electrode formed over and insulated from the surface of the p-type semiconductor region and self-aligned with an edge of the surface portion of the blue detector region and with an edge of the n+ source/drain region spaced apart from the surface portion of the blue detector region to form a blue select transistor;
- a green detector formed from an n-type region located in the p-type semiconductor region below the blue detector;
- a green-detector n-type deep contact plug in contact with the green detector and extending to the surface of the p-type semiconductor region;
- a pinned p-type region formed at the surface of the p-type semiconductor region over the top of the green-detector n-type deep contact plug, a surface portion of the green-detector n-type deep contact plug extending past an edge of the pinned p-type region;
- a green-select transistor n+ source/drain region spaced apart from the surface portion of the green detector region;
- a green polysilicon gate electrode formed over and insulated from the surface of the p-type semiconductor region and self-aligned with an edge of the surface portion of the green-detector n-type deep contact plug and with an edge of the n+ source/drain region to form a green select transistor;
- a red detector formed from an n-type region located in the p-type semiconductor region below the green detector;
- a red-detector n-type deep contact plug in contact with the red detector and extending to the surface of the p-type semiconductor region;
- a pinned p-type region formed at the surface of the p-type semiconductor region over the top of the red-detector n-type deep contact plug near the surface of the p-type semiconductor region, a surface portion of the red-detector n-type deep contact plug extending past the edge of the pinned p-type region;
- a red-select transistor n+ source/drain region spaced apart from the surface portion of the blue detector region;
- a red polysilicon gate electrode formed over and insulated from the surface of the p-type semiconductor region and self-aligned with an edge of the surface portion of the red-detector n-type deep contact plug and with an edge of the n+ source/drain region to form a red select transistor.

9. The multicolor CMOS pixel sensor of claim 8 wherein the p-type semiconductor region is a p-well formed in a body of semiconductor material.

10. The multicolor CMOS pixel sensor of claim 9 wherein the body of semiconductor material is a semiconductor substrate.

11. A multicolor CMOS pixel sensor formed in a p-type semiconductor region, the multicolor CMOS pixel sensor including:
- a first detector for a first color formed from an n-type region of semiconductor material located near the surface of the p-type semiconductor region;
- a first pinned p-type region formed at the surface of the p-type semiconductor region over the first detector, a surface portion of the n-type region for the first detector extending past an edge of the pinned p-type region;
- a second detector for a second color formed from an n-type region located in the p-type semiconductor region below the first detector;
- a second-detector n-type deep contact plug in contact with the second detector and extending to the surface of the p-type semiconductor region; and
- a second pinned p-type region formed at the surface of the p-type semiconductor region over the top of the second-detector n-type deep contact plug, a surface portion of the second-detector n-type deep contact plug extending past an edge of the second pinned p-type region.

12. The multicolor CMOS pixel sensor of claim 11, further including:
- a first polysilicon gate electrode formed over and insulated from the surface of the p-type semiconductor region and self-aligned with an edge of the surface portion of the n-type region for the first detector and with an edge of the n+ source/drain region to form a first-color select transistor; and
- a second polysilicon gate electrode formed over and insulated from the surface of the p-type semiconductor region and self-aligned with an edge of the surface portion of the second-detector n-type deep contact plug and with an edge of the n+ source/drain region to form a second-color select transistor.

13. The multicolor CMOS pixel sensor of claim 11, further including:
- a third detector for a third color formed from an n-type region located in the p-type semiconductor region below the second detector;
- a third-detector n-type deep contact plug in contact with the third detector and extending to the surface of the p-type semiconductor region;
- a third pinned p-type region formed at the surface of the p-type semiconductor region over the top of the third-detector n-type deep contact plug near the surface of the p-type semiconductor region, a surface portion of the third-detector n-type deep contact plug extending past the edge of the pinned p-type region.

14. The multicolor CMOS pixel sensor of claim 13, further including a third polysilicon gate electrode formed over and insulated from the surface of the p-type semiconductor region and self-aligned with an edge of the surface portion of the third-detector n-type deep contact plug and with an edge of the n+ source/drain region to form a third-color select transistor.

* * * * *